(12) United States Patent
Hirokane et al.

(10) Patent No.: US 9,142,883 B2
(45) Date of Patent: Sep. 22, 2015

(54) FILM-LIKE MEMBER AND ATTACHING METHOD THEREOF

(75) Inventors: Toru Hirokane, Chiba (JP); Yukihisa Koyanagi, Chiba (JP)

(73) Assignee: MITSUBISHI STEEL MFG. CO., LTD., Tokyo (JP)

( * ) Notice: Subject to any disclaimer, the term of this patent is extended or adjusted under 35 U.S.C. 154(b) by 379 days.

(21) Appl. No.: 13/884,401

(22) PCT Filed: Nov. 16, 2011

(86) PCT No.: PCT/JP2011/076386
§ 371 (c)(1),
(2), (4) Date: May 9, 2013

(87) PCT Pub. No.: WO2012/067142
PCT Pub. Date: May 24, 2012

(65) Prior Publication Data
US 2013/0222189 A1    Aug. 29, 2013

(30) Foreign Application Priority Data

Nov. 17, 2010  (JP) .................................. 2010-256933

(51) Int. Cl.
*H01Q 1/38*     (2006.01)
*B32B 3/10*     (2006.01)
*H01P 11/00*    (2006.01)
(Continued)

(52) U.S. Cl.
CPC .............. *H01Q 1/38* (2013.01); *B32B 37/0015* (2013.01); *H01P 11/00* (2013.01); *H01Q 1/243* (2013.01); *H05K 3/0058* (2013.01); *B32B 38/1866* (2013.01); *B32B 2309/105* (2013.01); *B32B 2457/00* (2013.01); *B32B 2457/20* (2013.01); *H05K 1/0284* (2013.01); *Y10T 29/49826* (2015.01); *Y10T 428/24314* (2015.01)

(58) Field of Classification Search
USPC ............... 343/700 MS; 428/136, 134; 29/428
See application file for complete search history.

(56) References Cited

U.S. PATENT DOCUMENTS 5,672,406 A * 9/1997 Challis et al. ................. 428/136
5,863,471 A * 1/1999 Stanek .......................... 261/107
(Continued)

FOREIGN PATENT DOCUMENTS

CN          2554879 Y     6/2003
CN       201146245 Y    11/2008
(Continued)

OTHER PUBLICATIONS

Japanese Office Action mailed Sep. 16, 2014.
International Search Report mailed on Feb. 14, 2012.
Extended European Search Report dated Apr. 29, 2014.
Japanese Office Action mailed Jan. 27, 2015.

*Primary Examiner* — Tan Ho
(74) *Attorney, Agent, or Firm* — IPUSA, PLLC (57) ABSTRACT

An attaching method of attaching a film-like member shaped like a plane face to a member having a surface shaped like a curved face including a first step of determining, by an analysis, a region where stress higher than that in a case where the film-like member is shaped like the plane face is generated when the film-like member is attached to the member shaped like the curved face, a second step of forming a slit at the region where the stress higher than that in the case where the film-like member is shaped like the plane face is generated, and a third step of attaching the film-like member having the formed slit to the member having the surface shaped like the curved face.

5 Claims, 7 Drawing Sheets

(51) Int. Cl.
*H05K 3/00* (2006.01)
*H01Q 1/24* (2006.01)
*B32B 37/00* (2006.01)
*H05K 1/02* (2006.01)
*B32B 38/18* (2006.01)

(56) References Cited

U.S. PATENT DOCUMENTS

| | | |
|---|---|---|
| 2003/0143371 A1 | 7/2003 | Conway et al. |
| 2009/0036834 A1 | 2/2009 | Voeller et al. |
| 2012/0007824 A1* | 1/2012 | Mi .............................. 345/174 |
| 2012/0094064 A1* | 4/2012 | Sato et al. ..................... 428/136 |
| 2012/0107553 A1* | 5/2012 | Appleton et al. ............. 428/136 |

FOREIGN PATENT DOCUMENTS

| | | |
|---|---|---|
| JP | 6-005662 | 1/1994 |
| JP | H06-018856 | 1/1994 |
| JP | 2000-234506 | 8/2000 |
| JP | 2000-258209 | 9/2000 |
| JP | 2003-258483 | 9/2003 |
| JP | 2005-348066 | 12/2005 |
| JP | 2006-222528 | 8/2006 |
| JP | 2008-117944 | 5/2008 |
| JP | 2012-019064 | 1/2012 |
| WO | 2010/123733 | 10/2010 |

\* cited by examiner

FILM-LIKE MEMBER AND ATTACHING METHOD THEREOF

TECHNICAL FIELD

The present invention relates to a film-like member, which is attached to a member having a surface shaped like a curved face, and an attaching method of the film-like member for attaching the film-like member to the surface shaped like the curved face.

BACKGROUND ART

For example, a member accommodated in a portable terminal device, a member accommodated in a television (TV) set, a wind shield (a front glass or a rear glass) of an automobile, or the like may have a surface shaped like a curved face. Further, there may be a case where a film-like member is attached to the surface shaped like the curved face.

For example, because a portable terminal device is carried by a user, improvement in miniaturization, thin profile, and design is required. Therefore, a member having the surface shaped like the curved face is gradually used inside the casings of portable terminal devices. There is a case where a film-like member such as a flexible board, on which an antenna pattern for communication is formed, is attached to the member having the surface shaped like the curved face (for example, Patent Documents 1 and 2).

[Patent Document 1] Japanese Laid-open Patent Publication No. 2008-117944

[Patent Document 2] Japanese Laid-open Patent Publication No. 2005-348066

DISCLOSURE OF THE INVENTION

Problems to be Solved by the Invention

However, when the film-like member shaped like a plane face is attached to the surface shaped like the curved face, wrinkles may be formed on the film-like member. Then, there is a problem that the film-like member deforms from an appropriate shape. For example, in a case where a film-like member, on which an antenna pattern for communication is formed, is attached to the surface shaped like the curved face, there is a problem wrinkles are formed to thereby deform an antenna pattern from an appropriate shape.

The present invention is provided in consideration of the above problems. The object of the present invention is to provide a film-like member in which wrinkles have difficulty being formed at a time of attaching the film-like member to a member having a surface shaped like a curved face and an attaching method of the film-like member of attaching the film-like member to the member having the surface shaped like the curved face.

Means for Solving Problems

An attaching method of attaching a film-like member shaped like a plane face to a member having a surface shaped like a curved face is required to include a first step of determining, by an analysis, a region where stress higher than that in a case where the film-like member is shaped like the plane face is generated when the film-like member is attached to the member shaped like the curved face; a second step of forming a slit at the region where the stress higher than that in the case where the film-like member is shaped like the plane face is generated; and a third step of attaching the film-like member having the formed slit to the member having the surface shaped like the curved face.

A film-like member shaped like a plane face to be attached to a member having a surface shaped like a curved face is required to include a slit provided at a region where stress higher than that in a case where the film-like member is shaped like the plane face is generated when the film-like member is attached to the member shaped like the curved face.

Effect of the Invention

According to the disclosed technique, it is possible to provide a film-like member in which wrinkles have difficulty being formed at a time of attaching the film-like member to a member having a surface shaped like a curved face and an attaching method of the film-like member of attaching the film-like member to the member having the surface shaped like the curved face.

BEST MODE FOR CARRYING OUT THE INVENTION

Hereinafter, preferred embodiments of the present invention are explained with reference to accompanying drawings. Where the same reference symbols may be attached to the same parts, and repeated description of the parts may be omitted. In the following description, an example of attaching a flexible board (a film-like member) including an antenna pattern to a member, which has a surface shaped like a curved face and is accommodated in a portable terminal device. However, the embodiment is not limited to this example. For example, the present invention is applicable to a case where the film-like member is attached to a member, which has a surface shaped like a curved face and is accommodated in a TV, a windshield (a front or rear glass) of an automobile, or a member, which has a surface shaped like a curved face and is accommodated in another product.

[Structure of Flexible Board]

Figure 1:
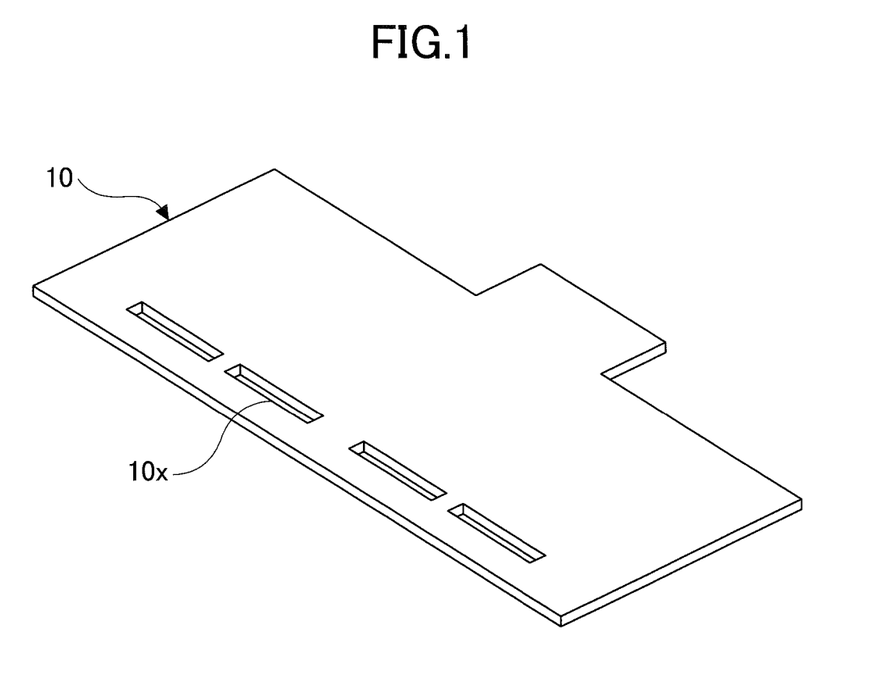
FIG. 1 is a perspective view of an exemplary flexible board of an embodiment.

FIG. 1 is a perspective view of an exemplary flexible board of the embodiment. Referring to FIG. 1, the flexible board 10 is shaped like a plane and has 4 slits in a rectangular shape in its plan view. The slits 10x are formed in a region where high stress is applied in order to prevent wrinkles from being formed at a time of attaching the flexible board 10 to a member having a surface shaped like a curved face. For example, the thickness of the flexible board 10 may be, for example, about 50 µm to about 75 µm. The flexible board 10 includes an antenna pattern (not illustrated) and functions as an antenna of a portable terminal device. The flexible board 10 is a typical example of a film-like member of the present invention.

In this application, the curved face designates a shape having at lease one rounded surface. The curved face is not limited to a shape having a uniform curvature and may include a complicated and three-dimensional curved shape. Further, in this application, the plane face designates a shape where a surface to be attached to a predetermined member is included in an arbitrary one plane. Said differently, the surface to be attached to the predetermined member does not include a curve. It is sufficient that the surface attached to the predetermined member is substantially included in an arbitrary one plane even though minute unevenness or the like is formed on the surface attached to the predetermined member.

Figure 2:
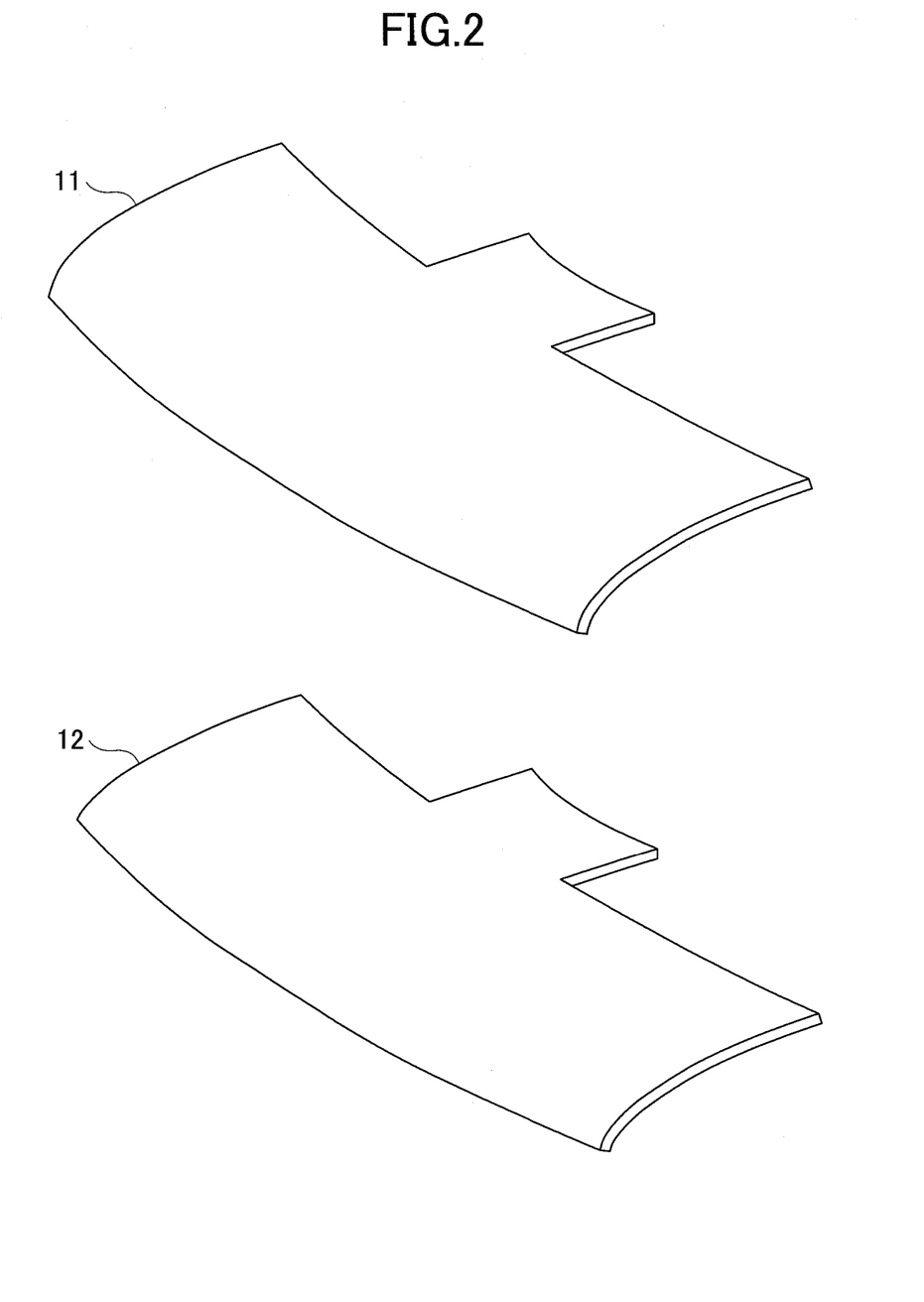
FIG. 2 is a perspective view of exemplary upper and lower members, between which a flexible board illustrated in FIG. 1 is interposed to be held.

FIG. 2 is a perspective view of exemplary upper and lower members, between which a flexible board illustrated in FIG. 1 is interposed so as to be held by the exemplary upper and lower members. Referring to FIG. 2, each of the upper member 11 and the lower member 12 is, for example, a resin molded body and has the same shape. Each of the upper member 11 and the lower member 12 includes a surface shaped like the curved face. The surfaces shaped like the curved face of the upper member 11 and the lower member 12 do not have a uniform curvature so as to form a complicated and three-dimensional curved shape. The surface shaped like the curved face of the upper member 11 and the lower member 12 is determined in consideration of a design of a casing of the portable terminal device. The upper member 11 and the lower member 12 are accommodated in the casing of the portable terminal device. The materials of the upper member 11 and the lower member 12 are not limited to the resin and may be a material such as a metal, rubber, or the like. In a case where the flexible board 10 functions as an antenna, a high-dielectric resin or the like may be used instead of an ABS resin in order to improve antenna characteristics.

Figure 3:
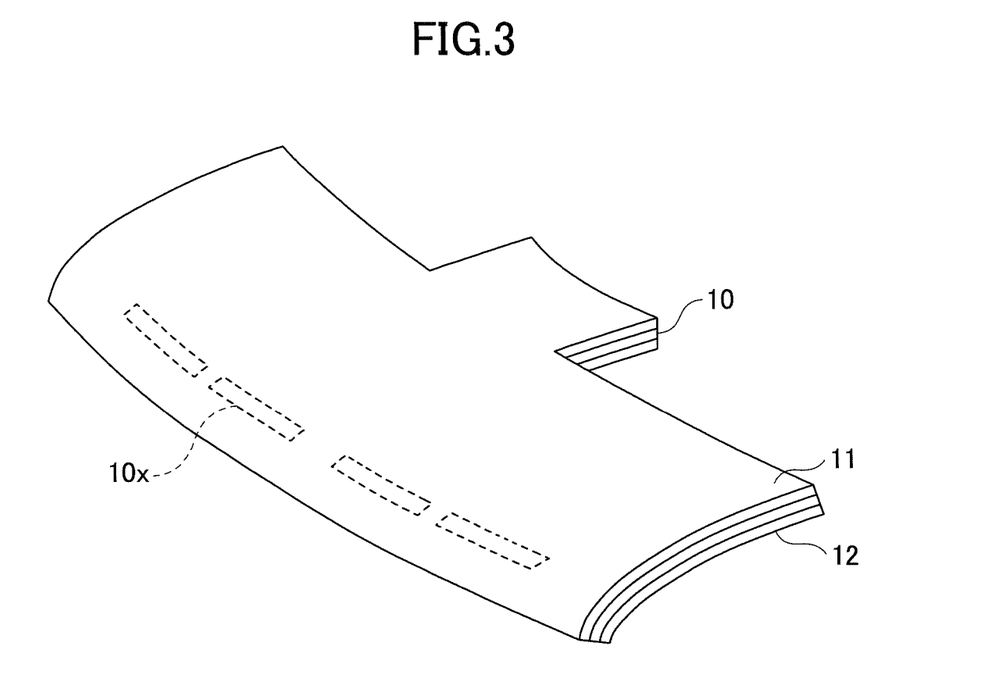
FIG. 3 is an exemplary perspective view of a state in which the flexible board illustrated in FIG. 1 is interposed to be held between the upper and lower members.

FIG. 3 is an exemplary perspective view of a state in which the flexible board illustrated in FIG. 1 is interposed to be held between the upper and lower members 11 and 12. Referring to FIG. 3, the flexible board 10 is interposed between the upper member 11 and the lower member 12. A double-stick tape (not illustrated) is provided on both surfaces of the flexible board 10. By interposing the flexible board 10 between the upper member 11 and the lower member 12 via the double-stick tape (not illustrated), the flexible board 10 is adhered between the upper member 11 and the lower member 12. Instead of the double-stick tape (not illustrated), an adhesion bond or the like may be used. Depending on types of the adhesion bond and the double-stick tape (not illustrated), after the flexible board 10 is interposed between the upper member 11 and the lower member 12, heat or pressure may be applied to the adhesion bond and the double-stick tape.

Conventionally, wrinkles are formed in a flexible board shaped like a plane face when the flexible board is attached to the member having the surface shaped like the curved face. Therefore, there is a problem that antenna characteristics are degraded by deformation of an antenna pattern deformed from an appropriate shape. However, although the flexible board 10 of the embodiment is shaped like the plane face, because the 4 slits 10x are formed in the flexible board 10, wrinkles can be hard to be formed even though the flexible board 10 is attached to the upper and lower members 11 and 12, each of which has the surface shaped like the curved face.

In order to make the wrinkles be hard to be formed even though the flexible board 10 is attached to the upper and lower members 11 and 12, each of which has the surface shaped like the curved face, it is necessary to form the slits 10x having appropriate shapes at appropriate positions of the flexible board 10. The inventors have conducted a FEM analysis to know high stress generated in a flexible board when the flexible board is attached to a member having a surface shaped like a curved face. Then, the inventors have found that wrinkles are hard to be formed on the flexible board by forming a slit in a region determined by the FEM analysis as having the generated high stress.

Therefore, the FEM analysis is conducted to know a region of the flexible board 10 which is shaped like the plane face and has the high stress generated when the flexible board 10 is attached to the upper and lower members 11 and 12 each having the surface shaped like the curved face. The 4 slits 10x are formed in the regions of the flexible board 10 determined as having the generated high stress. As a result, wrinkles are hard to be formed in the flexible board 10 after the flexible board 10 is attached to the upper and lower members 11 and 12.

Within this application, the "high stress" is higher than the stress of the flexible board shaped like the plane face. The flexible board shaped like the plane face is bent so as to be shaped like the curved face. Then, the stress is concentrated by a surface tension to thereby generate the "high stress".

[Analysis of the High Stress Generated in the Flexible Board]

Next, described is a method of a FEM analysis to know the region of the flexible board 10 where the high stress is generated when the flexible board 10 shaped like the plane face is attached to the upper and lower members 11 and 12 having the surface shaped like the curved face.

Figure 4:
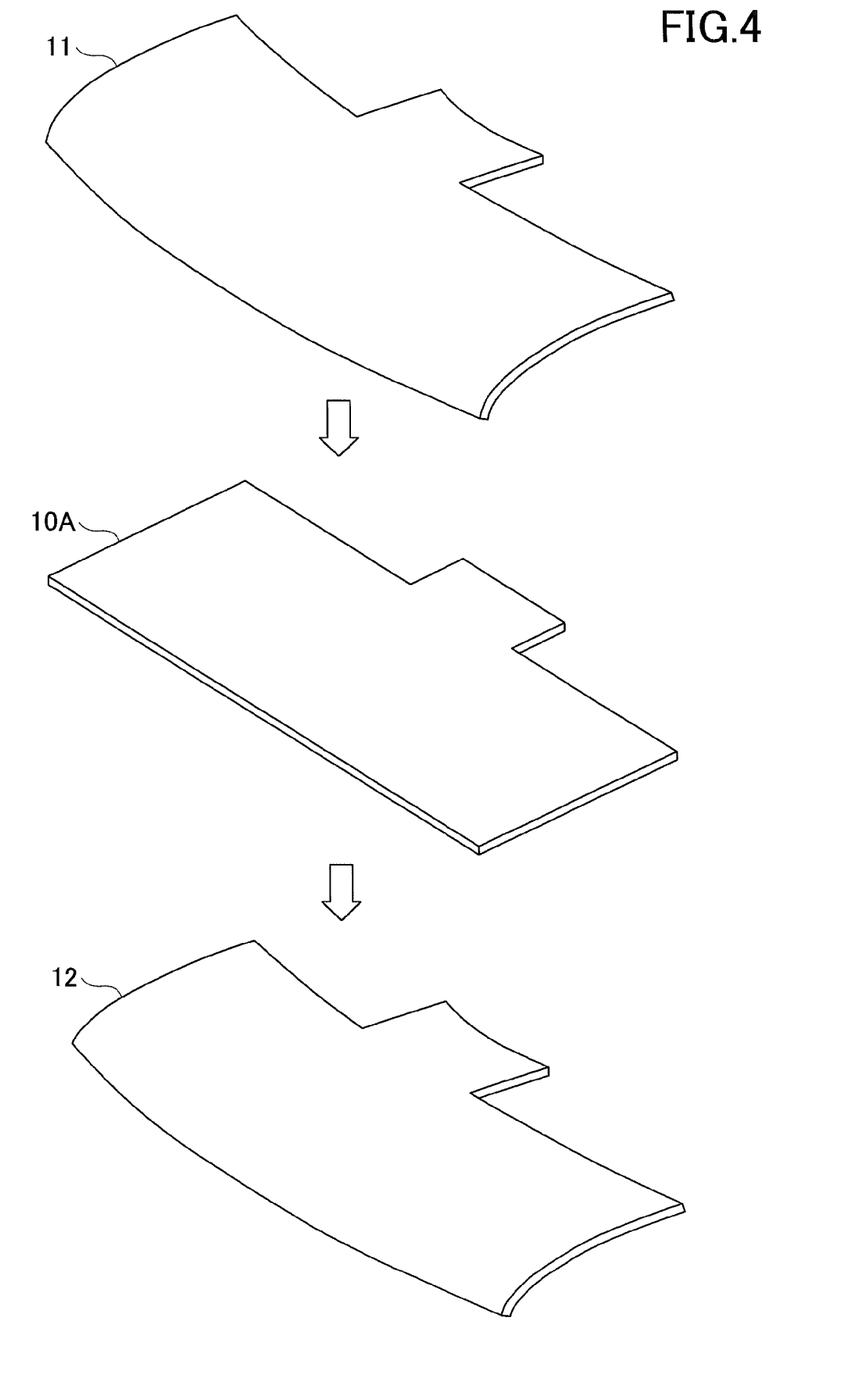
FIG. 4 is a first drawing explaining an analysis of regions of a flexible board where high stress is generated.
Figure 5:
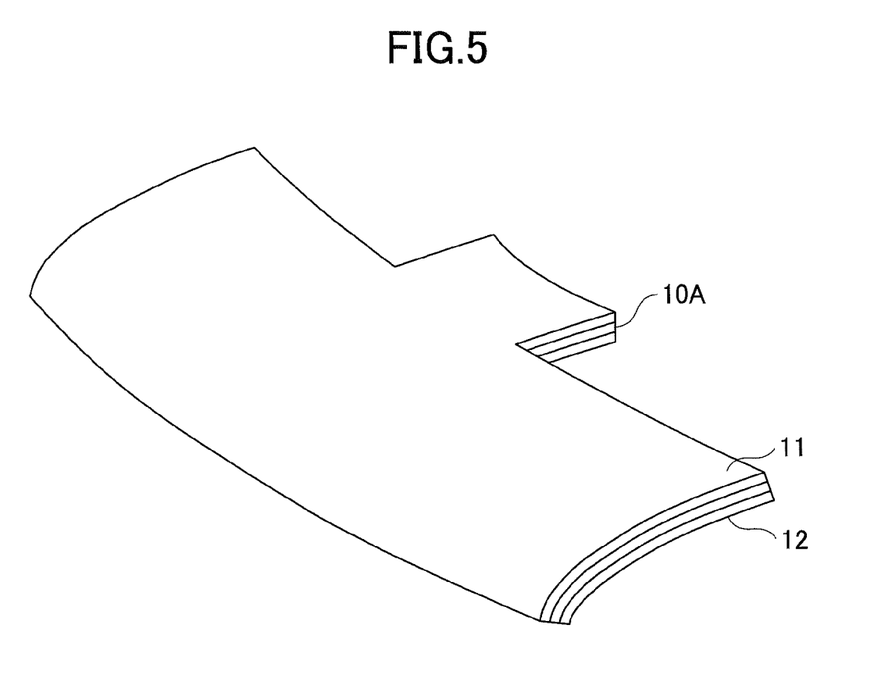
FIG. 5 is a second drawing explaining the analysis of regions of the flexible board where high stress is generated.

Referring to FIG. 4, the flexible board 10A shaped like the plane face and the upper and lower members 11 and 12 each having the surface shaped like the curved face are prepared. Referring to FIG. 5, the flexible board 10A is interposed between the upper member 11 and the lower member 12. The flexible board 10A shaped like the plane face in FIG. 4 is interposed between the upper and lower members 11 and 12 so as to be deformed to be shaped like the curved face corresponding to the surface shaped like the curved face of the upper and lower members 11 and 12. The flexible board 10A is before forming the slits 10x in the flexible board 10.

Figure 6:
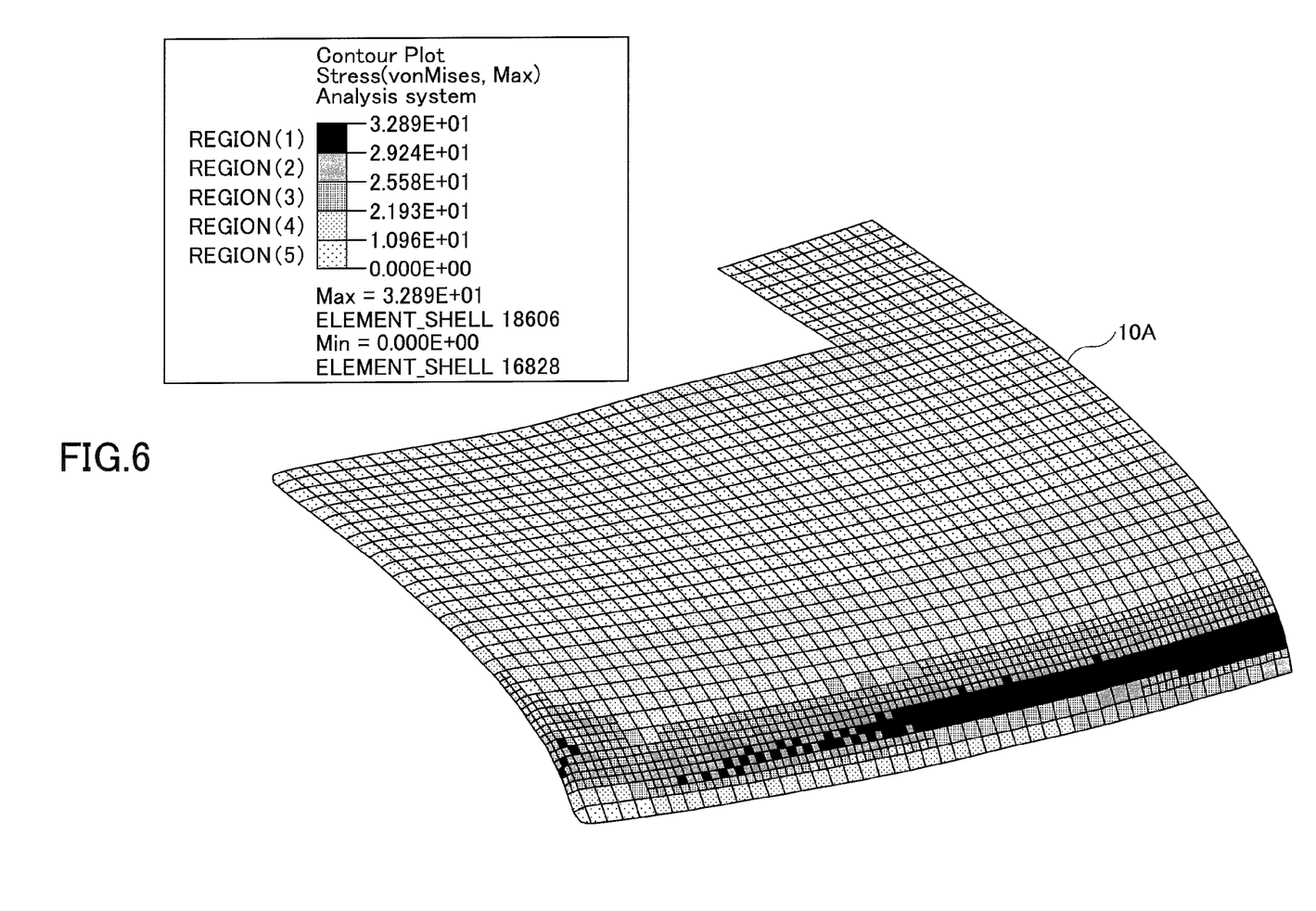
FIG. 6 is a third drawing explaining the analysis of regions of the flexible board where high stress is generated.

Next, in the state illustrated in FIG. 5, the region of the flexible board 10A where the high stress is generated is found by the FEM analysis. Because the flexible board 10A is bilaterally symmetrical, the FEM analysis is conducted using a half of the flexible board 10A. FIG. 6 illustrates an exemplary result of the FEM analysis conducted for the region where the high stress is generated in a flexible board, in which a slit is not formed. Referring to FIG. 6, a result of the FEM analysis is illustrated. The result shows 5 regions divided into a region (1) to a region (5) in response to the high stress generated in the flexible board 10A. In the region (1), the highest stress is generated. The stress is lowered from the region (2) to the region (4). In the region (5), the stress is the lowest. As described, it is confirmed that there is the region (1) where the highest stress is generated on the bottom side of FIG. 6.

Next, a region where the high stress is generated and a slit is to be formed is determined. The region where the high stress is generated and the slit is to be formed is determined may only be the region (1), in which the highest stress is generated, or may be the region (1) and the region (2). Said differently, the region where the high stress is generated and the slit is to be formed may be arbitrarily determined by selecting the regions in the vicinity of the region (1) so as to reduce the high stress of the flexible board. Within the embodiment, the region (1) and the region (2) are determined to be the region where the high stress is generated and the slit is to be formed.

Figure 7:
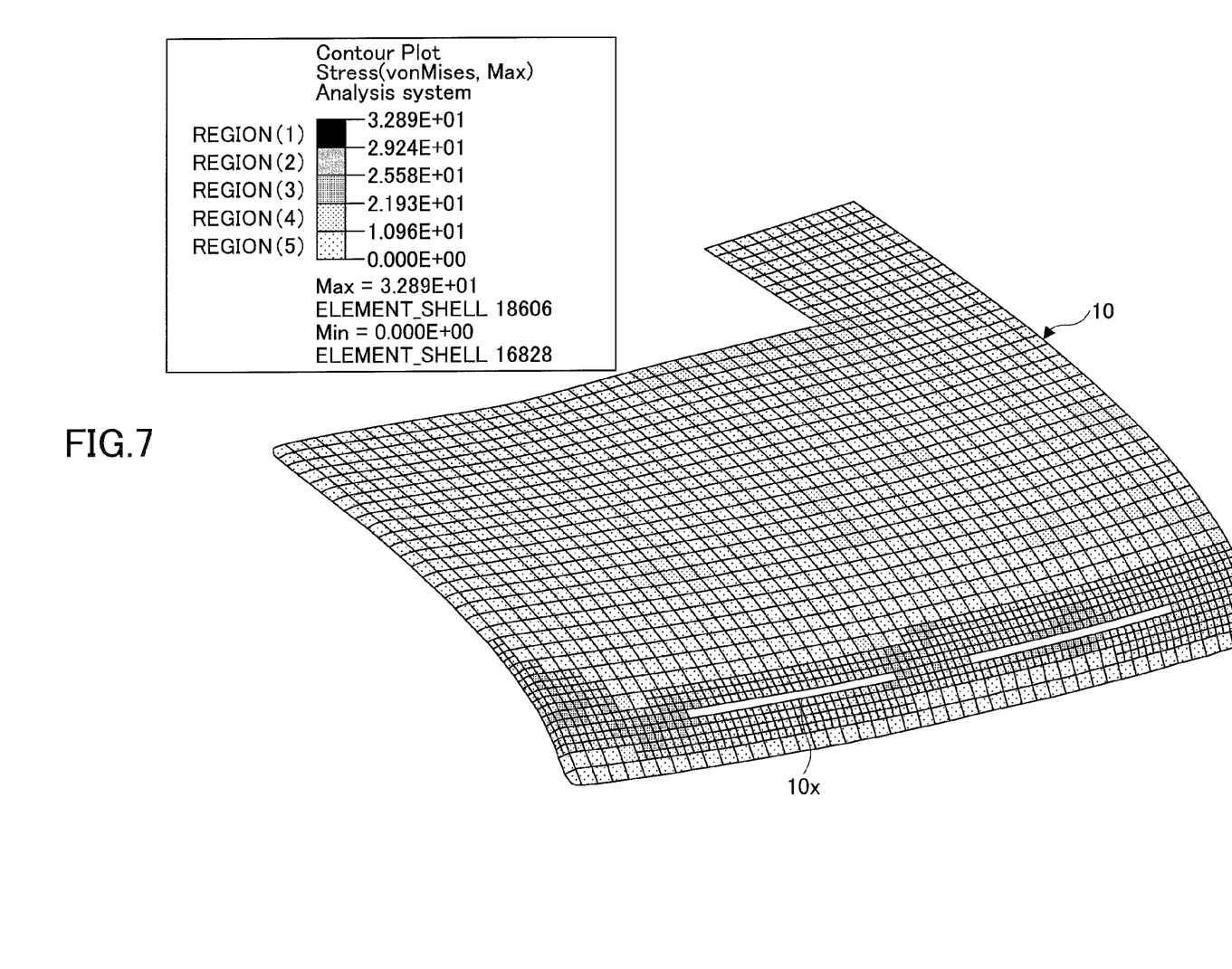
FIG. 7 is a fourth drawing explaining the analysis of regions of the flexible board where high stress is generated.

Next, referring to FIG. 5, the FEM analysis is conducted after replacing the flexible board 10A with the flexible board 10 (see FIG. 1) having the slit 10x formed in the region where the high stress is generated. FIG. 7 illustrates an exemplary result of the FEM analysis conducted for the region where the high stress is generated and the slit is formed. Referring to FIG. 7, in the flexible board 10, by forming the slit 10x in the region of the flexible board 10A where the high stress is generated, the regions (1) and (2) illustrated in FIG. 6 disappear. Said differently, the stress in the region corresponding to the region where the high stress is generated in the flexible board 10A is drastically reduced in the flexible board 10 in comparison with the region where the high stress is generated in the flexible board 10A. As described, by conducting the FEM analysis for the flexible board 10 having the slit formed in the region of the flexible board 10A where the high stress is generated, if the stress is drastically reduced in comparison with the region of the flexible board 10A where the high stress is generated, it can be confirmed that the region where the high stress is generated is properly determined.

As described, before the flexible board shaped like the plane face is attached to the upper and lower members 11 and 12 each having the surface shaped like the curved face, the FEM analysis is conducted to determine the region where the high stress is generated when the flexible board 10A (the flexible board 10 before forming the slit 10x) is attached to the upper and lower members 11 and 12 each having the surface shaped like the curved face. Then, the slit 10x is formed in the region of the flexible board 10A where the high stress is generated to thereby produce the flexible board 10 having the slit 10x. Then, the flexible board 10 is interposed between the upper and lower members 11 and 12 to attach the flexible board to the upper and lower members 11 and 12. Thus, the stress in the region corresponding to the region where the high stress is generated in the flexible board 10A is drastically reduced in the flexible board 10 in comparison with the region where the high stress is generated in the flexible board 10A. Therefore, wrinkles are hard to be formed in the flexible board 10.

Further, if the flexible board 10 is an antenna, it is possible to prevent wrinkles from being formed thereby avoiding deformation of the antenna pattern from the appropriate shape. Thus, it is possible to prevent degradation of the antenna characteristics.

The number of the slits 10x to be formed in the region of the flexible board 10A where the high stress is formed is not limited to 4, and may be 1 to 3 or 5 or greater. As long as the FEM analysis is conducted while an arbitrary number of slits in an arbitrary shape are formed in the region where the high stress is generated to resultantly reduce the stress generated in the flexible board 10, the number of the slits can be any.

Further, the slit 10x is not limited to be shaped like a rectangular in its plan view and may be shaped like an ellipse. Further, the slit 10x may be shaped like a rectangular in its plan view and the short sides of the rectangular may be changed to an arc (a round shape).

Although the invention has been described with respect to embodiments, the present invention is not to be thus limited but are to be construed as embodying various modifications and alternative constructions within the basic teachings herein set forth.

For example, the flexible board may not be always interposed between the upper member and the lower member, and may be adhered to a member having a surface shaped like the curved face by an adhesion bond or a double-stick tape.

An object to be adhered to the member having the surface shaped like the curved face is not limited to the flexible board shaped like the plane face and may be a film-like member shaped like the plane face such as a film antenna. Here, the film-like member shaped like the plane face has the thickness smaller than the length and the width, the maximum thickness of an arbitrary value, and flexibility so as to be deformed.

This international application is based on Japanese Priority Patent Application No. 2010-256933 filed on Nov. 17, 2010, the entire contents of Japanese Priority Patent Application No. 2010-256933 are hereby incorporated herein by reference.

EXPLANATION OF REFERENCE SIGNS 10, 10A: flexible board;
10x: slit;
11: upper member; and
12: lower member.

The invention claimed is:

1. An attaching method of attaching a film-like member shaped like a plane face to a member having a surface shaped like a curved face, the attaching method comprising:
    a first step of determining, by an analysis, a region where stress higher than that in a case where the film-like member is shaped like the plane face is generated when the film-like member is attached to the member shaped like the curved face;
    a second step of forming a slit at the region where the stress higher than that in the case where the film-like member is shaped like the plane face is generated; and
    a third step of attaching the film-like member having the formed slit to the member having the surface shaped like the curved face.

2. The attaching method according to claim 1, wherein, in the first step, the region where the stress higher than that in the case where the film-like member is shaped like the plane face is generated is determined by an FEM analysis.

3. The attaching method according to claim 1, wherein, in the third step, another member having a surface shaped like the curved surface is provided so that a number of the members become two, and the film-like member is interposed between the two members having the surface shaped like the curved face.

4. A film-like member shaped like a plane face to be attached to a member having a surface shaped like a curved face, the film-like member comprising:
    a slit provided at a region where stress higher than that in a case where the film-like member is shaped like the plane face is generated when the film-like member is attached to the member shaped like the curved face.

5. The film-like member according to claim 4, wherein an antenna pattern is provided in the film-like member.

* * * * *